United States Patent
Balakrishnan (10) Patent No.: US 10,535,393 B1
(45) Date of Patent: Jan. 14, 2020

(54) CONFIGURING DYNAMIC RANDOM ACCESS MEMORY REFRESHES FOR SYSTEMS HAVING MULTIPLE RANKS OF MEMORY

(71) Applicant: Advanced Micro Devices, Inc., Santa Clara, CA (US)

(72) Inventor: Kedarnath Balakrishnan, Bangalore (IN)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/041,778

(22) Filed: Jul. 21, 2018

(51) Int. Cl.
  *G11C 11/406* (2006.01)
  *G11C 11/409* (2006.01)

(52) U.S. Cl.
  CPC ...... *G11C 11/40618* (2013.01); *G11C 11/409* (2013.01); *G11C 11/40603* (2013.01); *G11C 11/40607* (2013.01); *G11C 11/40622* (2013.01)

(58) Field of Classification Search
  CPC ........ G11C 11/40618; G11C 11/40603; G11C 11/40607; G11C 11/40622; G11C 11/409
  USPC ...................................................... 365/222
  See application file for complete search history.

(56) References Cited

U.S. PATENT DOCUMENTS

2015/0187412 A1* 7/2015 Ware ................... G06F 13/1636
  711/106
2017/0269861 A1* 9/2017 Lu ......................... G06F 3/0647

FOREIGN PATENT DOCUMENTS

WO    2017172301    10/2017

OTHER PUBLICATIONS

R. Balasubramonian et al., A Dram Refresh Tutorial, Nov. 2013, accessed via the Internet at http://utaharch.blogspot.com/2013/11/a-dram-refresh-tutorial.html, last accessed Jul. 21, 2018.
I. Bhati et al., DRAM Refresh Mechanisms, Penalties, and Trade-Offs, IEEE Transactions on Computers, Mar. 2015.

\* cited by examiner

*Primary Examiner* — Fernando Hidalgo
(74) *Attorney, Agent, or Firm* — Park, Vaughan, Fleming & Dowler LLP (57) ABSTRACT

An electronic device including a memory functional block having multiple ranks of memory and a memory controller functional block coupled to the memory. The memory controller includes refresh logic that detects, based on buffered memory accesses for each rank of memory of the ranks of memory, two or more ranks of memory for which a refresh is to be performed during a refresh interval. Based at least in part on one or more properties of buffered memory accesses for the two or more ranks of memory, the refresh logic determines a refresh order for performing refreshes for the two or more ranks of memory during the refresh interval. The memory controller then performs, in the refresh order, refreshes for the two or more ranks of memory during the refresh interval.

21 Claims, 4 Drawing Sheets

CONFIGURING DYNAMIC RANDOM ACCESS MEMORY REFRESHES FOR SYSTEMS HAVING MULTIPLE RANKS OF MEMORY

BACKGROUND

Related Art

Some electronic devices include dynamic random access memory (DRAM) such as double data rate fourth-generation (DDR4) synchronous DRAM. For example, a desktop computer may include multiple gigabytes of DDR4 SDRAM as a main memory that is used for storing information for various computational operations (i.e., data, instructions, etc.). Generally, DRAM is semiconductor memory that uses integrated circuit elements fabricated on semiconductor integrated circuit chips for storing information. For example, some DRAM uses capacitors for storing bits of information, with the capacitors being charged for storing a logical value of 1 and discharged for storing a logical value of 0. DRAM is "dynamic" in the sense that the circuit elements used to store information lose charge over time, which means that information stored in DRAM will eventually be lost if the circuit elements are not periodically recharged. For example, for DRAM that uses capacitors as storage elements, a charged state of the capacitors is lost due to leakage and the capacitors must therefore be recharged, or "refreshed," in order to maintain stored information.

Some electronic devices include memories having a large amount of DRAM, which are typically implemented on multiple separate DRAM integrated circuit chips (or, more simply, "DRAM chips") that are combined to form the memory. In these electronic devices, separate DRAM chips among the multiple DRAM chips can be divided into logical and/or physical groups for issues such as power control, addressing/memory accesses, etc. For example, in some electronic devices, a number of DRAM chips are mounted to memory modules (e.g., dual inline memory modules or DIMMs) and the memory modules are mounted in sockets that are coupled to a communication bus in the electronic devices. In such electronic devices, electrical power connections, chip selects, and other power, control, and access signals may be connected to subsets of the DRAM integrated circuit chips on the memory modules, thereby logically and/or physically grouping the DRAM chips or portions thereof. For example, in some electronic devices, DRAM chips on a memory module are included in, or can be operated as, one of N ranks (e.g., 4 ranks, 8 ranks, etc.), with each chip including M banks (e.g., 32 banks) and each bank including a number of arrays of DRAM circuit elements for storing information.

In electronic devices that include multiple DRAM chips, the above-described refresh operation can be performed for logical and/or physical groups of DRAM chips. For example, some of these electronic devices perform refreshes at the rank level. In other words, when performing a refresh operation to recharge circuit elements in DRAM chips, these electronic devices refresh the one or more DRAM chips in ranks as a group. In such electronic devices, in order to refresh a rank, the rank is first removed or blocked from use for performing memory accesses (e.g., reads, writes, etc.), such as by de-asserting a chip availability signal for the DRAM chips in the rank. The circuit elements in the DRAM chips in the rank are then refreshed (i.e., rewritten with existing information to refresh the existing information). Following the refresh, the DRAM chips for the rank are restored for use for performing memory accesses.

The process for refreshing circuit elements in the DRAM chips in a rank takes several hundred clock cycles, which can equate to multiple hundreds of nanoseconds, during which time the DRAM chips in the rank are unavailable for performing memory accesses. Entities in the electronic device that depend on the results of memory access operations, and the operations performed thereby, can therefore be delayed for a significant amount of time before memory access operations can be completed due to refresh operations. Because DRAM refresh operations cause delays for other operations in electronic devices, improvements in DRAM refresh operations are beneficial for electronic devices.

BRIEF DESCRIPTION OF THE FIGURES

Throughout the figures and the description, like reference numerals refer to the same figure elements.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that the term may have significant additional aspects that are not recited herein for clarity and brevity and thus the description is not intended to limit the term.

Functional block: functional block refers to a group, collection, and/or set of one or more interrelated circuit elements such as integrated circuit elements, discrete circuit elements, etc. The circuit elements are "interrelated" in that circuit elements share at least one property. For instance, the interrelated circuit elements may be included in, fabricated on, or otherwise coupled to a particular integrated circuit chip or portion thereof, may be involved in the performance of given functions (computational or processing functions, memory functions, etc.), may be controlled by a common control element, etc. A functional block can include any number of circuit elements, from a single circuit element (e.g., a single integrated circuit logic gate) to millions or billions of circuit elements (e.g., an integrated circuit memory), etc.

Overview

The described embodiments include an electronic device having a memory functional block and a memory controller functional block. The memory functional block includes multiple ranks of dynamic random access (DRAM) memory circuits. The memory circuits are "dynamic" in that the memory circuits lose charge over time and thus must be periodically refreshed in order to avoid the loss of stored information. The memory controller functional block includes refresh logic that determines how and when refresh operations are performed for the individual ranks of memory during refresh intervals. For example, the memory controller can determine, based on specified criteria, particular ranks of memory that are to be refreshed and a refresh order in which the ranks of memory are to be refreshed during a refresh interval.

In some embodiments, prior to a refresh interval, the refresh logic performs operations for determining a refresh order for the refresh interval. Generally, the refresh order is an order in which identified ranks of memory (or, more simply, "ranks") are to be refreshed during the refresh interval. When determining the refresh order, the refresh logic first identifies ranks for which a refresh is to be performed during the refresh interval. For example, the refresh logic may identify ranks for which more than a specified number of memory accesses are presently buffered by the memory controller (where "accesses" include memory reads, writes, moves, deletions, etc.). The refresh logic then divides the refresh interval into sub-intervals based at least in part on a number of identified ranks, each sub-interval to be used for performing a refresh for one of the identified ranks. For example, if there are five identified ranks, the refresh logic may divide the refresh interval into five subintervals. Next, based on one or more criteria relating to properties of the buffered memory accesses and/or interactions between the memory controller and the identified ranks, the refresh logic determines the refresh order for performing refreshes for the identified ranks. At the end of these operations, the refresh logic has determined both the number of sub-intervals for the refresh interval and the refresh order in which refreshes are to be performed in the sub-intervals.

In some embodiments, the criteria relating to the one or more properties of the buffered memory accesses that are used to determine the refresh order include criteria such as a count of buffered memory accesses for each rank (i.e., the total number of memory accesses that are pending in the memory controller for each rank), a type of each of the buffered memory accesses from among a set of types (e.g., reads, writes, moves, deletes, etc.), a priority of the buffered memory accesses from among a set of priorities, etc. For example, in some embodiments, the memory controller keeps a per-rank record of a number of buffered memory accesses at each of a set of two or more priority levels, and the criteria is a number of buffered memory accesses of a specified priority, an average priority level for the buffered memory accesses for each rank, etc. In some embodiments, the criteria relating to the interactions between the memory controller and the identified ranks include criteria such as types of commands that have been sent or are to be sent to ranks, the interrelationship between ranks, etc. For example, the criteria may be a relative timing of the previous sending (or not) of such commands to the identified ranks and/or other ranks by the memory controller. In some embodiments, the memory controller keeps one or more running records (i.e., records updated in real time and as events occur) of values that are used to determine if corresponding criteria are met.

In some embodiments, after determining the refresh order, the refresh logic causes the memory controller to perform refresh operations in the refresh order. For the first rank in the refresh order, the memory controller sends the refresh in the first sub-interval, which means pausing buffered memory accesses for the first rank and performing the refresh for the first rank substantially immediately upon the commencement of the refresh interval. For a second rank and subsequent ranks in the refresh order, while a refresh is performed for one or more preceding ranks in the refresh order, the memory controller performs the buffered memory accesses for that rank. In this way, when the sub-interval for performing the refresh for each rank after the first rank occurs, that rank is prepared for the refresh. In other words, the memory controller has cleared (to the extent possible) buffered memory accesses for the rank before refreshing the rank. By performing the buffered memory accesses before performing the refresh as described, the memory controller can help to avoid delays for entities dependent on buffered memory accesses (e.g., processors, input-output devices, etc.). In some embodiments, the memory controller also avoids sending specified commands to a rank within a specified time of the sub-interval for that rank occurring, thereby avoiding corresponding delays for the refresh during the sub-interval.

By determining the refresh order and performing buffered memory accesses prior to performing refreshes using the refresh order as described, the described embodiments improve the performance of refresh operations. More specifically, the described embodiments can avoid some of the delay experienced in existing systems when refresh operations are performed reactively and without using a refresh order—and subsequently sending paused buffered memory operations after performing respective refresh operations causes memory accesses to be delayed. This can help to avoid unnecessary delays for executing program code, idle computational elements, and other inefficiencies that occur in existing electronic devices that perform DRAM refreshes. The improved functioning of the electronic device can lead in turn to higher user satisfaction.

Electronic Device

Figure 1:
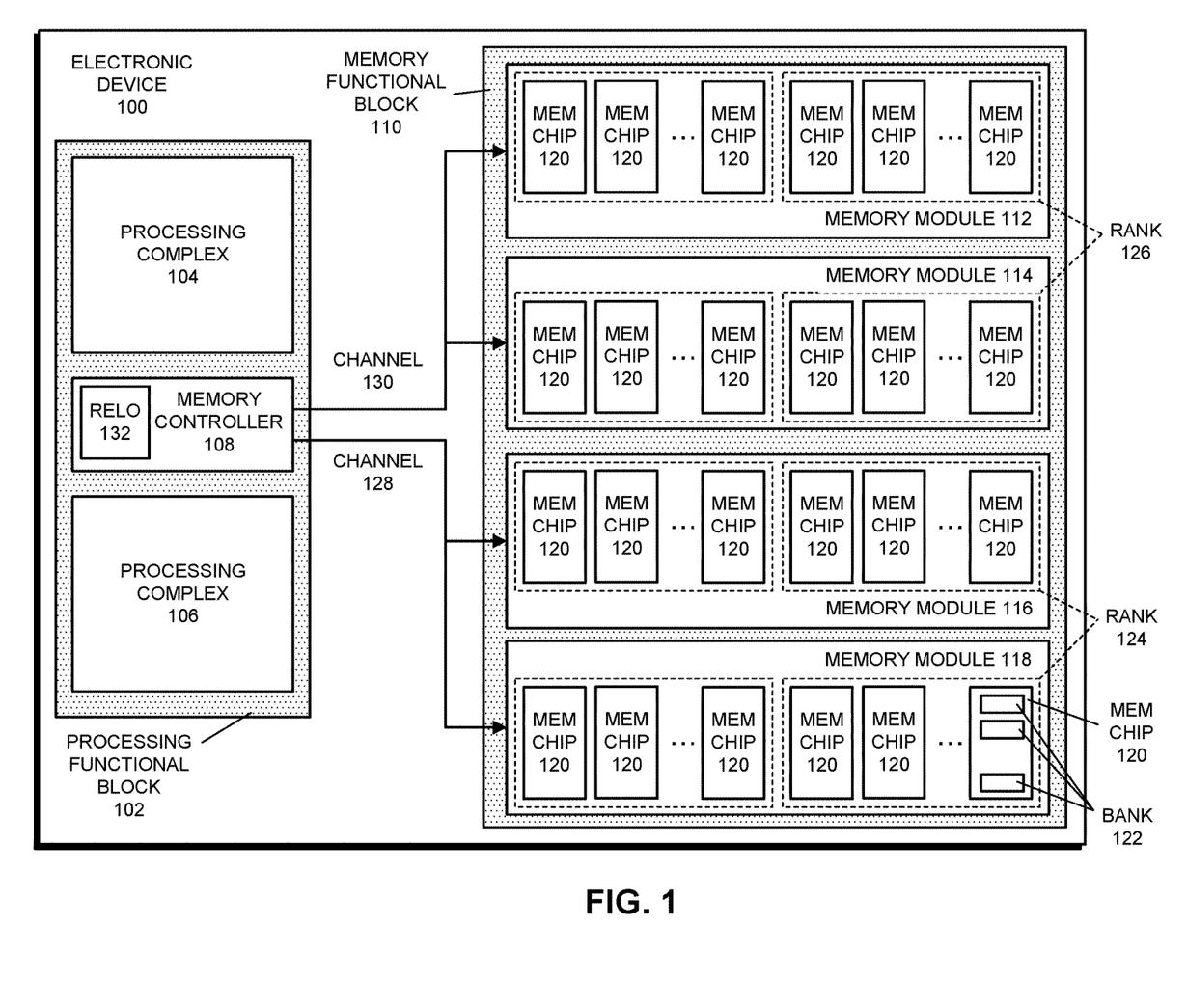
FIG. 1 presents a block diagram illustrating an electronic device in accordance with some embodiments.

FIG. 1 presents a block diagram illustrating electronic device 100 in accordance with some embodiments. As can be seen in FIG. 1, electronic device 100 includes processing functional block 102 and memory functional block 110. Generally, processing functional block 102 and memory functional block 110 are implemented in hardware, i.e., using various circuit elements and devices. For example, processing functional block 102 and memory functional block 110 can be entirely fabricated on one or more semiconductor chips, including on one or more separate semiconductor chips for each of the functional blocks, can be fashioned from semiconductor chips in combination with discrete circuit elements, can be fabricated from discrete circuit elements alone, etc. As described herein, processing functional block 102 and memory functional block 110 perform operations for handling refreshes of dynamic random access memory (DRAM) in memory functional block 110.

Processing functional block 102 is a functional block that performs computational and other operations (e.g., control operations, configuration operations, etc.) in electronic device 100. As can be seen in FIG. 1, processing functional block 102 includes processing complexes 104-106. Processing complexes 104-106 are functional blocks that include elements such as a central processing units (CPU) or CPU cores, application specific integrated circuits (ASICs), general purpose graphics processing units (GPGPUs), field-programmable gate arrays (FPGA), etc. for performing the computational and other operations. For example, in some embodiments, one or both of processing complexes 104-106 include multiple CPU cores, caches, and other elements coupled together via a high-speed interconnect. Processing functional block 102 also includes memory controller 108, which is described in more detail below.

Memory functional block 110 is functional block in electronic device 100 that performs operations of a memory (e.g., a "main" memory) for electronic device 100. Memory functional block 110 includes memory circuits such as fourth-generation double data rate synchronous DRAM (DDR4 SDRAM) and/or other types of memory circuits for storing data and instructions for use by functional blocks in electronic device 100 and control circuits for handling accesses of the data and instructions that are stored in the memory circuits and for performing other control or configuration operations. In the described embodiments, at least some of the memory circuits in memory functional block 110 are "dynamic" memory circuits. Dynamic memory circuits store information (e.g., bits of information such as data, instructions, etc.) using circuit elements such as capacitors that lose charge over time due to leakage and/or other charge loss mechanisms. Because charge is lost by the circuit elements, a refresh operation is periodically performed to recharge the circuit elements, thereby avoiding the loss of stored information. For example, in some embodiments, a given circuit element may need to be refreshed every N microseconds in order to ensure that information stored in the circuit element is not lost due to leakage and/or the other charge loss mechanisms.

As can be seen in FIG. 1, memory functional block 110 includes memory modules 112-118, which are modules such as dual in-line memory modules (DIMMs) that include a number of memory integrated circuit chips (MEM CHIP) 120 (e.g., DDR SDRAM integrated circuit chips) mounted on both sides of a circuit board (only one side of memory modules 112-118 is shown in FIG. 1). In the described embodiments, each memory chip 120 includes a number of banks such as banks 122 (the banks are labeled for only one of memory chips 120 in FIG. 1 for clarity), each bank including a number of arrays of memory circuits (not shown). The memory chips 120 on memory modules 112-118 are logically and/or physically divided into eight ranks on the side of memory modules 112-118 shown in FIG. 1 (ranks 124-126 are labeled for only some of the memory modules in FIG. 1 for clarity), as shown using dashed lines. In some embodiments, control signals, power signals, address signals, chip selects, and/or other signals are coupled separately to each of the ranks, enabling the ranks to be separately addressed/accessed, controlled, powered up and down, and/or interacted with. The described embodiments perform refreshes for memory circuits in memory functional block 110 at the resolution of ranks. In other words, when refreshing the DRAM memory circuits, the described embodiments select a rank and perform the refresh on the memory circuits of that rank.

In some embodiments, some or all of the memory chips 120 include at least two separate DRAM memory chips arranged in a stack. In other words, two or more separate memory chips, each including a set of banks, is physically arranged in a stack, which can be called a "3D stack." In these embodiments, the memory chips include communication mechanisms such as through-silicon vias for communicating with and between the memory chips in the stack, and at least one chip in the stack includes interface circuitry for communicating with memory controller 108 and other entities external to the stack. In some embodiments, the above-described ranks are or include at least a portion of the chips in a single stack of memory chips.

Memory controller 108 is a functional block that manages, controls, and otherwise handles interactions between processing functional block 102 and memory functional block 110. For example, memory controller 108 performs memory accesses (i.e., reads, writes, deletions, moves, etc.) on behalf of processing functional block 102, performs configuration and control operations for memory functional block 110, and/or other operations. In some embodiments, memory controller 108 schedules, causes, and/or controls the performance of refreshes for the DRAM memory circuits in memory functional block 110. In some embodiments, memory controller 108 communicates with the respective individual memory modules in memory modules 112-118 via channels such as channels 128-130, which each include buses, wires, guides, and/or other communication elements and circuitry.

In some embodiments, memory accesses are buffered by memory controller 108. In other words, upon receiving a request, command, or other indication that a memory access is to be performed from an entity such as processing complex 104, memory controller 108 determines that the memory access (i.e., the request, command, etc.—or information based thereon) is to be held in a buffer, a queue, or another memory element in memory controller 108, and is not to be sent immediately to the memory functional block 110 for resolution. For example, memory controller 108 may buffer memory accesses in order to enable memory access (re)ordering, to avoid conflicting with other operations being performed by the rank to be accessed, to avoid interfering with other traffic on the corresponding channel, etc. In some of these embodiments, memory controller 108 is limited, such as by an architectural specification or other system rule, to buffering, for each rank, only a predetermined number of memory accesses at a given time (e.g., 7, 8, etc.) and/or only holding buffered memory accesses for a specified amount of time before the memory accesses are to be sent to memory functional block 110.

Memory controller 108 includes refresh logic (RELO) 132. Refresh logic 132 is a functional block in memory controller 108 that performs operations for determining a refresh order in which ranks of memory are to be refreshed during a refresh interval. As described herein, refresh logic 132, based on properties of buffered memory accesses and/or interactions between memory controller 108 and ranks of memory, determines the refresh order and then causes memory controller to send respective refreshes to each rank that is to be refreshed based on the refresh order.

Electronic device 100 is simplified for illustrative purposes. In some embodiments, however, electronic device 100 includes additional or different functional blocks, subsystems, elements, and/or communication paths. For example, electronic device 100 may include display subsystems, power subsystems, input-output (I/O) subsystems, etc. Electronic device 100 generally includes sufficient functional blocks, etc. to perform the operations herein described.

Electronic device 100 can be, or can be included in, any device that performs computational operations. For example, electronic device 100 can be, or can be included in, a desktop computer, a laptop computer, a wearable computing device, a tablet computer, a piece of virtual or augmented reality equipment, a smart phone, an artificial intelligence (AI) or machine learning device, a server, a network appliance, a toy, a piece of audio-visual equipment, a home appliance, a vehicle, etc., and/or combinations thereof.

Refresh Operation

In the described embodiments, dynamic memory circuits in memory functional block are refreshed, during a "refresh operation," to avoid the loss of stored information. In some embodiments, the refresh operation is performed at the resolution of a rank of memory, so that all of the memory circuits in a rank of memory are refreshed during a single refresh operation. In some embodiments, during a refresh operation, a rank of memory to be refreshed is first removed or blocked from active use, so that memory accesses and other operations involving information stored in the memory circuits of the rank of memory are paused, terminated, or otherwise delayed for the duration of the refresh operation. For example, in some embodiments, a memory controller stores pending memory access operations in a buffer, queue, or other memory circuit associated with the rank until after the refresh operation is completed. The rank of memory is then refreshed. For example, in some embodiments, for a set of rows of memory elements in a rank, during the refresh operation, until each row has been refreshed, the memory controller stores a value from a set of bits in a next row of memory circuits into a row buffer, then precharges the memory circuits of that row of memory circuits, and next writes the stored value from the row buffer back into that row of memory circuits. Once the refresh operation is completed, i.e., the memory circuits in the rank are all refreshed, the rank of memory is released back to active use, so that memory accesses and other operations involving information stored in the memory circuits, including the buffered memory accesses, are performed normally.

Performing Refreshes for Multiple Ranks of Memory Using a Refresh Order

Figure 2:
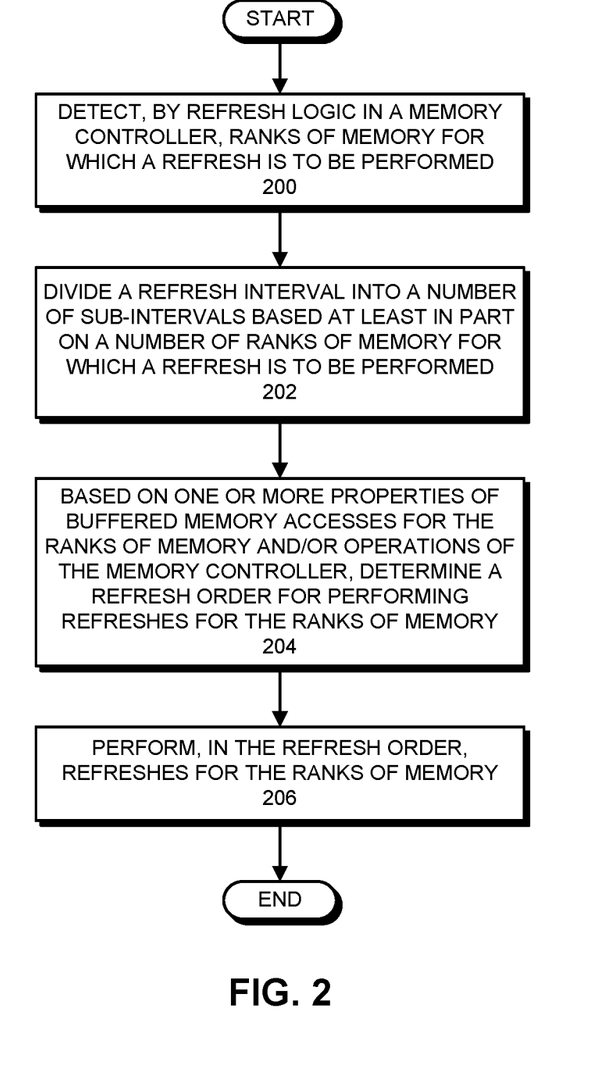
FIG. 2 presents a flowchart illustrating a process for selecting a refresh order to be used for performing refreshes for ranks of memory in accordance with some embodiments.

In the described embodiments, refresh logic in a memory controller determines an order in which dynamic memory circuits in ranks of memory from among multiple ranks of memory are refreshed. FIG. 2 presents a flowchart illustrating a process for selecting a refresh order to be used for performing refreshes for ranks of memory in accordance with some embodiments. Note that the operations shown in FIG. 2 are presented as a general example of operations performed by some embodiments. The operations performed by other embodiments include different operations and/or operations that are performed in a different order. For the example in FIG. 2, an electronic device having a similar internal arrangement to electronic device 100 is described as performing various operations. In some embodiments, however, a differently-arranged electronic device performs the described operations. For example, a different number of ranks, memory modules, etc. may be present in the electronic device.

The operations shown in FIG. 2 start when refresh logic (e.g., refresh logic 132) in a memory controller (e.g., memory controller 108) detects ranks of memory for which a refresh is to be performed (step 200). For this operation, the refresh logic performs one or more checks to determine, based on information about, associated with, or otherwise related to the ranks of memory, that a refresh is to be performed during a next refresh interval. For example, in some embodiments, the refresh logic detects ranks of memory that are in or nearing a specified state, such as ranks for which a memory controller has buffered (and possibly deliberately buffered/delayed) a sufficient number of memory accesses that at least some of the buffered memory accesses should be sent during the next refresh interval to avoid violating corresponding memory access rules. For this case, a limit on the permissible number of buffered memory accesses may be dictated by an architectural specification, a rule in the electronic device, and/or by timing constraints—in that buffered memory accesses may need to be sent before becoming stale, before a requesting device times out, etc.

The refresh logic then divides a refresh interval into a number of sub-intervals based at least in part on a number of ranks of memory for which a refresh is to be performed (step 202). During this operation, in some embodiments, the refresh logic divides the refresh interval into a number of sub-intervals that is equal to the number of ranks of memory for which a refresh is to be performed. For example, if five out of eight ranks are to be refreshed during the refresh interval, the refresh logic may divide the refresh interval into five equal sub-intervals, so that a refresh interval of N microseconds (e.g., 4 microseconds, 2 microseconds, etc.) is divided into sub-intervals of N/5 microseconds. In some embodiments, the refresh logic uses, in addition to the number of ranks of memory for which a refresh is to be performed, one or more other inputs or factors for determining the number, duration of, and/or arrangement of the sub-intervals. For example, a current state of each rank of memory (e.g., a number of buffered memory accesses, etc.) may be used to divide the refresh interval into sub-intervals of respective different lengths of time.

In some embodiments, a minimum and/or maximum number of sub-intervals is used. For example, a specified minimum number of ranks of memory may be selected as ranks of memory for which a refresh is to be performed, regardless of whether at least the minimum number of ranks have been determined to need a refresh in step 200. In this case, steps 200-202 will involve at least the minimum number of ranks—and thus sub-intervals. In these embodiments, a default or initial refresh order, as described in more detail below, may be used to dictate at least some of the ranks of memory to be refreshed when less than the minimum number of ranks is determined to need a refresh. As another example, a specified maximum number of ranks (e.g., as limited by the time taken to refresh each rank within the refresh interval) may be selected as ranks of memory for which a refresh is to be performed—and steps 200-202 will involve at most the maximum number of ranks and thus sub-intervals.

The refresh logic next, based on one or more properties of the buffered memory accesses for the ranks of memory and/or operations of the memory controller, determines a refresh order for performing refreshes for the ranks of memory (step 204). Generally, for this operation, the refresh logic determines (i.e., generates, selects, etc.) a refresh order based on present conditions of buffered memory accesses, the ranks, and/or the memory controller. The determined refresh order has, in view of the buffered memory accesses and the other present conditions, refresh operations for the ranks ordered in such a way as to help reduce the impact on the overall performance of the electronic device of performing the refreshes. In other words, a refresh order is determined for which refreshes (which, particularly in existing electronic devices, might otherwise block the performance of buffered memory accesses) are performed in a manner that reduces delay in performing buffered memory accesses. This means that entities (e.g., processing complexes 104-106, etc.) that are dependent on the buffered memory accesses are less likely to be wholly or partially idle, waiting for the completion of buffered memory accesses that are delayed due to refreshes.

In some embodiments, a property of the buffered memory accesses that is used for determining the refresh order is a number of memory accesses that are buffered for each rank of memory that is to be refreshed. For example, in some embodiments, ranks of memory having more than N buffered memory accesses (e.g., 5, 7, etc.) are to be refreshed, and the refresh order is selected based on the actual number of buffered memory accesses for each rank of memory. For instance, assume that N=5, a maximum of 7 buffered memory accesses may be held for any rank of memory in accordance with an architectural specification, and four ranks of memory have the following numbers of buffered memory accesses: $rank_0=5$, $rank_1=7$, $rank_2=6$, and $rank_3=5$. In this case, a possible refresh order is: $rank_0$, $rank_3$, $rank_2$, and $rank_1$, so that $rank_0$ is first in the refresh order, $rank_3$ is second in the refresh order, etc.

In some embodiments, a property of the buffered memory accesses that is used for determining the refresh order is priorities of memory accesses that are buffered for each rank of memory that is to be refreshed. For example, in some embodiments, memory accesses from various entities in the electronic device are assigned, by the memory controller, corresponding priorities from among a set of two or more priorities. For instance, in these embodiments, memory accesses from I/O subsystems may be assigned lower priorities than memory accesses from processing complexes, memory accesses from particular software entities (e.g., browsers, word processors, etc.) may be assigned lower priorities than memory accesses from other software entities (e.g., operating systems, firmware, etc), etc. In these embodiments, the refresh order is selected based on counts of buffered memory accesses having specified priorities, an average or sum of the priorities of the buffered memory accesses, and/or another characteristic of the priorities of buffered memory accesses. For example, assume that four ranks of memory are to be refreshed, that the priorities include at least a lowest priority and a highest priority, and that the four ranks of memory have buffered memory accesses of the highest priority as follows: $rank_0=0$, $rank_1=3$, $rank_2=1$, and $rank_3=1$. In this case, a possible refresh order is: $rank_1$, $rank_2$, $rank_3$, and $rank_0$, so that $rank_1$ is first in the refresh order, $rank_2$ is second in the refresh order, etc.

In some embodiments, a property of the buffered memory accesses that is used for determining the refresh order is types of memory accesses that are buffered for each rank of memory that is to be refreshed. For example, in some embodiments, memory accesses are of types including memory reads, memory writes, memory deletions, memory moves, etc. In these embodiments, the refresh order is selected based on counts of buffered memory accesses having specified types, an average or sum of the buffered memory accesses having one or more of the types, and/or another characteristic of the types of buffered memory accesses. For example, assume that five ranks of memory are to be refreshed, that the types include at least a write type and a read type, and that the five ranks of memory have buffered memory accesses of the write type as follows: $rank_0=5$, $rank_1=2$, $rank_2=6$, $rank_3=2$, and $rank_4=3$. In this case, a possible refresh order is: $rank_2$, $rank_0$, $rank_4$, $rank_1$, and $rank_3$, so that $rank_2$ is first in the refresh order, $rank_0$ is second in the refresh order, etc.

In some embodiments, an operation of the memory controller that is used for determining the refresh order is commands previously sent by the memory controller to the ranks of memory. For example, in some embodiments, when the memory controller sends a command (e.g., a page open command, etc.) to a rank of memory, the rank of memory performs a number of operations and then waits for a delay period (e.g., N microseconds) before subsequent operations, and thus commands, can be processed by the rank of memory. In some embodiments, the refresh order is selected based on whether or not commands were sent to ranks of memory within the delay period. For example, assume that three ranks of memory, $rank_0$, $rank_1$, and $rank_2$, are to be refreshed and that one of the specified commands was sent to $rank_0$ M nanoseconds ago, where M<<N In this case, a possible refresh order is: $rank_1$, $rank_2$, $rank_3$, and $rank_0$, so that $rank_1$ is first in the refresh order, $rank_2$ is second in the refresh order, etc.

In some embodiments, a combination of two or more of the above-described properties of the buffered memory accesses for the ranks of memory and/or operations of the memory controller is used for determining the refresh order. For example, in some embodiments, combined or average value of two or more of the properties (e.g., counts of buffered memory accesses and priority of the buffered memory accesses for each rank) is used in determining the refresh order. In some embodiments, a mathematical, logical, and/or other function is used for determining the combined value.

In some embodiments, the refresh logic or another entity keeps a running record of the one or more properties of the buffered memory accesses for the ranks of memory and/or operations of the memory controller that are used to determine the refresh order. For example, assuming an embodiment in which the properties of the buffered memory accesses include a number of memory accesses that are buffered for each rank of memory, the refresh logic, the memory controller, and/or another entity can keep a counter of buffered memory accesses for each rank of memory that is incremented when a memory access is buffered (e.g., stored in a buffer or queue in the memory controller) and decremented when a memory access is unbuffered and performed or otherwise handled. As another example, assuming an embodiment in which the operations of the memory controller are used to determine the refresh order, the refresh logic, the memory controller, and/or another entity may keep a timer that is started when specified command(s) are sent to each rank of memory, store a time stamp when specified command(s) are sent to each rank of memory, etc. In some embodiments, the refresh logic or another entity generates or otherwise determines the record of the one or more properties of the buffered memory accesses for the ranks of memory and/or operations of the memory controller that are used to determine the refresh order as needed. For example, the refresh logic or the other entity may compute, as needed, a count of buffered memory accesses using a tail pointer for a buffer in which memory accesses are stored, etc.

In some embodiments, a static/unchanging default or initial refresh order can be used for some or all refresh intervals. For example, the default refresh order can be used in situations when no ranks are operating at or near the above-described specified state in which at least some of the buffered memory accesses should be sent during the next refresh interval to avoid violating corresponding memory access rules. In some embodiments, the default or initial refresh order is provided by an external entity, such as in a configuration file or in firmware. In some embodiments, the refresh order determined in FIG. 2 is a modification of the default or initial refresh order.

In some embodiments, one or more rules, guidelines, thresholds, functions, etc. are used for determining the refresh order based on the above-described properties of the buffered memory accesses for the ranks of memory and/or operations of the memory controller. In some of these embodiments, the one or more rules, guidelines, thresholds, functions, etc. can be received from an external source, such as a software entity, a configuration file, firmware, etc.

Figure 3:
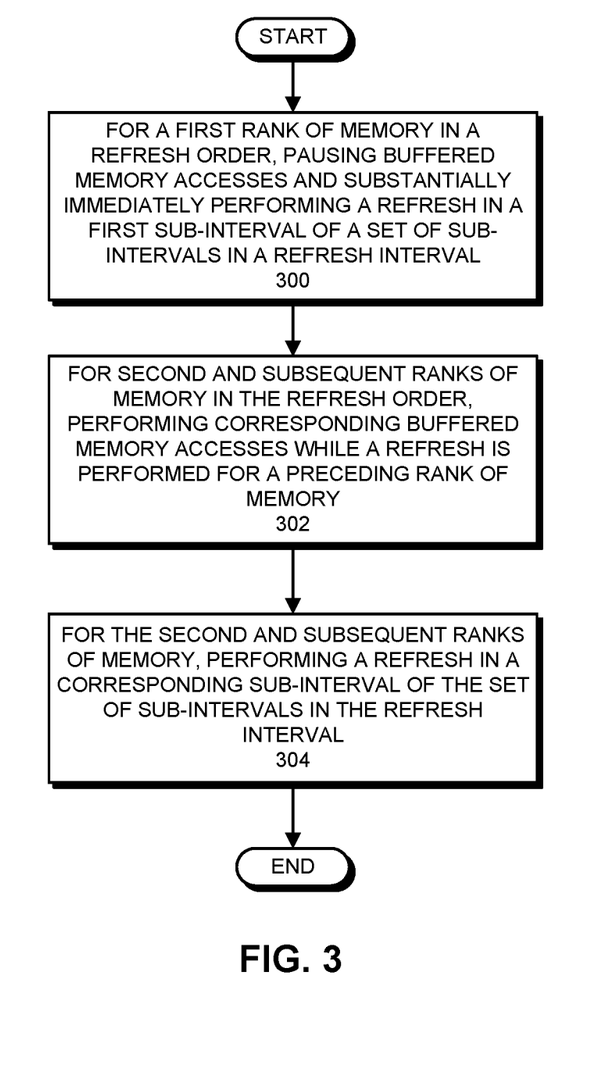
FIG. 3 presents a flowchart illustrating a process for performing refreshes for ranks of memory using a refresh order in accordance with some embodiments.

The refresh logic then causes the memory controller to perform, in the refresh order, the refreshes for the ranks of memory (step 206). For this operation, the refresh logic communicates, to the memory controller, the refresh order. The memory controller then uses the refresh order for performing refreshes during the corresponding refresh interval. FIG. 3 presents a flowchart illustrating a process for performing refreshes for ranks of memory using a refresh order in accordance with some embodiments. Note that the operations shown in FIG. 3 are presented as a general example of operations performed by some embodiments. The operations performed by other embodiments include different operations and/or operations that are performed in a different order. For the example in FIG. 3, an electronic device having a similar internal arrangement to electronic device 100 is described as performing various operations. In some embodiments, however, a differently-arranged electronic device performs the described operations.

The operations shown in FIG. 3 start when the memory controller, for a first rank of memory in the refresh order, pauses buffered memory accesses and performs a refresh in the first sub-interval of the set of sub-intervals in the refresh interval (step 300). Generally, and as described in more detail herein, one of the benefits of the described embodiments is that ranks of memory can be prepared for a pending refresh by sending the corresponding buffered memory accesses prior to the sub-interval in which the refresh is performed. In some embodiments, for the first rank of memory in the refresh order, however, there is not time in the refresh interval for sending the corresponding buffered memory accesses. Instead, the buffered memory accesses are "paused" by being held in a buffer in the memory controller and not performed until after the refresh is completed. The refresh is performed "substantially immediately" in that the refresh for the first rank of memory in the refresh order is performed at or very soon after the commencement of the refresh interval (i.e., at the commencement of the first sub-interval of the refresh interval). In some embodiments, the operations of FIG. 2 may be performed in such a way and with such timing that the refresh order is generated/prepared just in time for commencing the refreshing of ranks of memory in the refresh order during the refresh interval. Thus, as soon as the refresh order is prepared, the refresh may be performed for the first rank of memory in the first sub-interval—i.e., may be performed "substantially immediately."

Figure 4:
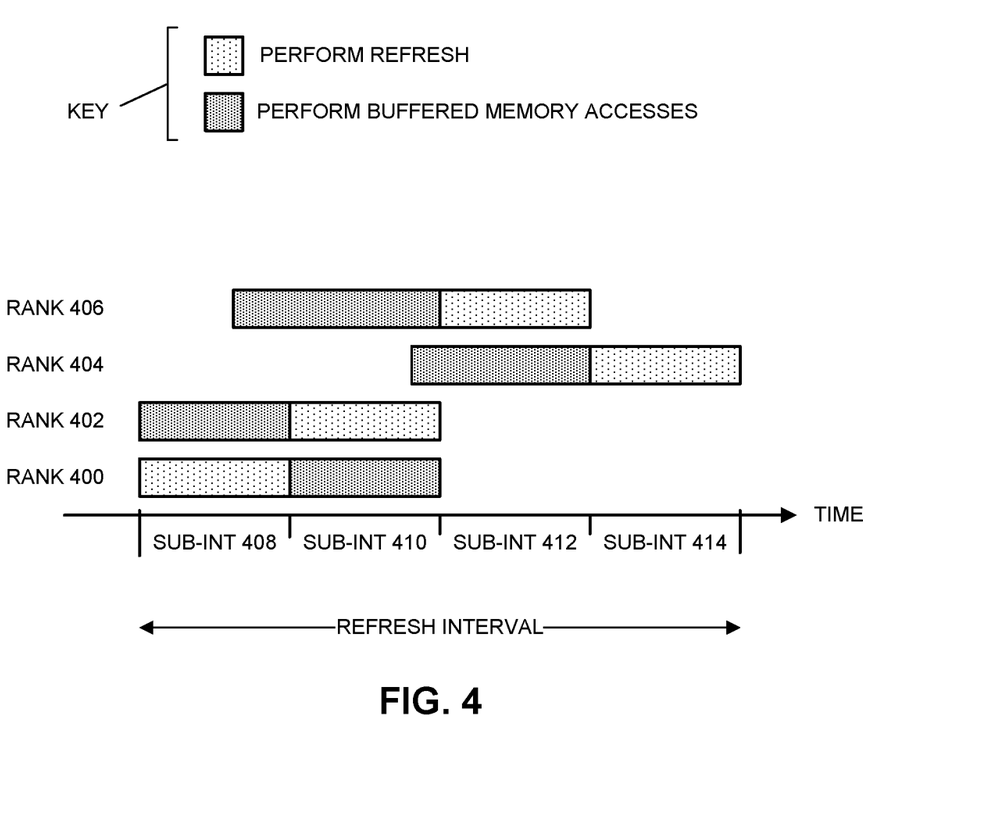
FIG. 4 presents a timeline diagram illustrating performing refresh operations for ranks of memory in accordance with some embodiments.

FIG. 4 presents a timeline diagram illustrating performing refresh operations for ranks of memory in accordance with some embodiments. More specifically, FIG. 4 presents an illustration of the refreshes performed based on the refresh order as shown in FIG. 3. Note that FIG. 4 is presented as an example of refresh operations for one embodiment, but other embodiments operate differently, such as refreshing a different number of ranks of memory and/or refreshing ranks of memory in a different order, performing buffered memory accesses at different times, etc. As can be seen in FIG. 4, the refresh order is as follows: (1) memory rank (RANK) 400, (2) memory rank 402, (3) memory rank 406, and (4) memory rank 404. As described for step 300 of FIG. 3 above, a refresh operation is performed for memory rank (RANK) 400, which is the first rank of memory in the refresh order, substantially immediately upon the commencement of the refresh interval, i.e., in sub-interval (SUB-INT) 408. The performance of buffered memory accesses for memory rank 400 does not occur until after sub-interval 408 in the refresh interval, i.e., during sub-interval 410 (or possibly later).

Returning to FIG. 3, for second and subsequent ranks of memory in the refresh order, the memory controller performs corresponding buffered memory accesses while a refresh is being performed for a preceding rank of memory (step 302). During this operation, the memory controller performs, for a given rank of memory, as many buffered memory accesses as can be performed prior to the commencement of the refresh for the given rank of memory. In other words, buffered memory reads, writes, etc. are sent to the rank of memory to be performed therein, thereby completing the memory accesses. In some cases, most, if not all, buffered memory accesses for the given rank of memory are performed prior to the commencement of the refresh for the given rank of memory during a corresponding sub-interval. Returning to FIG. 4, and as described for step 302 of FIG. 3 above, buffered memory accesses are performed for rank 402 during sub-interval 408, buffered memory accesses are performed for rank 404 during sub-intervals 410-412, and buffered memory accesses are performed for rank 406 during sub-intervals 408-410.

By performing the buffered memory accesses before the commencement of the refresh as shown in FIGS. 3-4, the described embodiments can avoid delaying operations for other entities in the electronic device, e.g., processing complexes 104-106, etc., that depend on the results of the buffered memory accesses. Note, however, that the other entities in the electronic device may generate new memory accesses that will be buffered by the memory controller during the refresh for the given rank of memory, including generating memory accesses generated before the sub-interval, but within a threshold time of the sub-interval. Memory accesses generated in this way/at these times are paused during the refresh.

Returning to FIG. 3, for the second and subsequent ranks of memory, the memory controller performs a refresh in a corresponding sub-interval of a set of sub-intervals in the refresh interval (step 304). As can be seen in FIG. 4, and as described for step 304 of FIG. 3, a refresh operation is performed for memory rank 402, the second rank of memory in the refresh order, in sub-interval 410, a refresh operation is performed for memory rank 406, the third rank of memory in the refresh order, in sub-interval 412, and a refresh operation is performed for memory rank 404, the fourth rank of memory in the refresh order, in sub-interval 414.

The described embodiments can improve the performance of the electronic device (in contrast to existing electronic devices) when multiple ranks are operating at or near capacity in terms of processing memory accesses. This is true because the refreshes are organized, as shown in FIGS. 2-4, so that buffered memory stores are performed, to the extent possible, before corresponding refreshes are performed. This stands in contrast to existing electronic devices, which are reactive—to ranks reaching the state where buffered memory accesses must be sent—and less organized and efficient in the approach to refreshes.

Per-Bank Refreshes

In the embodiments described herein, and the example in FIGS. 2-4, refresh operations are performed at the rank level (i.e., with rank resolution). The particular number of banks and DRAM chips per rank, however, varies in accordance with the configuration of the electronic device, the DRAM memory technology or architecture in use, the arrangement of memory modules, etc. For example, in some embodiments, a rank includes only one DRAM chip, includes one or more banks, etc. Thus, when refreshing "ranks," one or more banks within the ranks may be refreshed. In some embodiments, the number and arrangement of banks refreshed during a refresh operation includes less than all of the banks in a rank—i.e., only some of the banks in a rank are refreshed during a given refresh interval (or sub-interval). For example, in some embodiments, one or more banks within a multiple-bank rank can be separately refreshed. In these embodiments, the operations described for the refreshing of ranks can be adapted to apply to the one or more banks within ranks. For example, the refresh interval and/or refresh order can be determined at the bank level and/or the rank-and-bank level and the refreshes can be performed accordingly.

In some embodiments, an electronic device (e.g., electronic device 100, and/or some portion thereof) uses code and/or data stored on a non-transitory computer-readable storage medium to perform some or all of the operations herein described. More specifically, the electronic device reads the code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs).

In some embodiments, one or more hardware modules are configured to perform the operations herein described. For example, the hardware modules can include, but are not limited to, one or more processors/cores/central processing units (CPUs), application-specific integrated circuit (ASIC) chips, field-programmable gate arrays (FPGAs), compute units, embedded processors, graphics processors (GPUs)/graphics cores, pipelines, Accelerated Processing Units (APUs), system management units, power controllers, and/or other programmable-logic devices. When such hardware modules are activated, the hardware modules perform some or all of the operations. In some embodiments, the hardware modules include one or more general purpose circuits that are configured by executing instructions (program code, firmware, etc.) to perform the operations.

In some embodiments, a data structure representative of some or all of the structures and mechanisms described herein (e.g., processing functional block 102, memory functional block 110, and/or some portion thereof) is stored on a non-transitory computer-readable storage medium that includes a database or other data structure which can be read by an electronic device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the system performs a first operation, a second operation, etc.," the system performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device, comprising:
   a memory functional block that includes multiple ranks of memory; and
   a memory controller functional block coupled to the memory, the memory controller including refresh logic that is configured to:
   detect, based on buffered memory accesses for each rank of memory of the ranks of memory, two or more ranks of memory for which a refresh is to be performed during a refresh interval;
   based at least in part on one or more properties of buffered memory accesses for the two or more ranks of memory, determine a refresh order for performing refreshes for the two or more ranks of memory during the refresh interval, wherein each rank of memory is included at a respective place in the refresh order relative to other ranks of memory from the two or more ranks of memory based at least in part on the one or more properties of the buffered memory accesses; and
   perform, in the refresh order, refreshes for the two or more ranks of memory during the refresh interval.

2. The electronic device of claim 1, wherein, when performing, in the refresh order, the refreshes for the two or more ranks of memory during the refresh interval, the refresh logic is configured to:
   for a given rank of memory of the two or more ranks of memory that is first in the refresh order, pause corresponding buffered memory accesses and performing the refresh for the given rank of memory substantially immediately upon the commencement of the refresh interval.

3. The electronic device of claim 1, wherein when performing, in the refresh order, refreshes for the two or more ranks of memory during the refresh interval, the refresh logic is configured to:
while a refresh is performed for a preceding rank of memory of the ranks of memory in the refresh order, performing corresponding buffered memory accesses for a given rank of memory of the ranks of memory, thereby preparing the given rank of memory for a subsequent refresh.

4. The electronic device of claim 3, wherein the refresh logic is further configured to:
while the refresh is performed for the preceding rank of memory of the ranks of memory in the refresh order, pause sending specified memory commands to the given rank of memory, thereby preparing the given rank of memory for the subsequent refresh.

5. The electronic device of claim 1, wherein the refresh logic is further configured to:
dividing the refresh interval into a number of sub-intervals based at least in part on a number of the ranks of memory for which a refresh is to be performed during the refresh interval, wherein a refresh is to be performed for a different one of the two or more ranks of memory during each sub-interval.

6. The electronic device of claim 1, wherein:
the properties of the buffered memory accesses comprise a count of the buffered memory accesses; and
a rank of memory having more buffered memory accesses is included later in the refresh order than a rank of memory having fewer buffered memory accesses.

7. The electronic device of claim 1, wherein:
the properties of the buffered memory accesses comprise a type of each of the memory accesses; and
a rank of memory having more of a given type of buffered memory accesses is included earlier in the refresh order than a rank of memory having fewer of the given type of buffered memory accesses.

8. The electronic device of claim 7, wherein the type of each of the memory accesses includes one of a memory read or a memory write.

9. The electronic device of claim 1, wherein:
the properties of the buffered memory accesses comprise a priority of the memory accesses; and
a rank of memory having more higher-priority buffered memory accesses is included earlier in the refresh order than a rank of memory having fewer higher-priority buffered memory accesses.

10. The electronic device of claim 1, wherein the refresh logic is further configured to:
based on, in addition to the one or more properties of the buffered memory accesses, operations performed or to be performed by the memory controller, determine a refresh order for performing refreshes during the refresh interval for the at least one of the ranks of memory.

11. The electronic device of claim 1, wherein a refresh is to be performed for a given rank of memory when a specified number of memory accesses are buffered in the given rank of memory.

12. The electronic device of claim 1, wherein:
each rank includes one or more banks of memory; and
the detecting, determining, and performing operations are performed at the resolution of banks of memory within the ranks of memory, so that only a portion of the one or more banks of memory in a given rank of memory may be refreshed during the refresh interval.

13. A method for operating an electronic device having a memory functional block that includes multiple ranks of memory and a memory controller functional block that includes refresh logic, the method comprising:
detecting, by the refresh logic, based on buffered memory accesses for each rank of memory of the ranks of memory, two or more ranks of memory for which a refresh is to be performed during a refresh interval;
based at least in part on one or more properties of buffered memory accesses for the two or more ranks of memory, determining, by the refresh logic, a refresh order for performing refreshes for the two or more ranks of memory during the refresh interval, wherein each rank of memory is included at a respective place in the refresh order relative to other ranks of memory from the two or more ranks of memory based at least in part on the one or more properties of the buffered memory accesses; and
performing, by the memory controller, in the refresh order, refreshes for the two or more ranks of memory during the refresh interval.

14. The method of claim 13, wherein performing, in the refresh order, the refreshes for the two or more ranks of memory during the refresh interval comprises:
for a given rank of memory of the two or more ranks of memory that is first in the refresh order, pausing corresponding buffered memory accesses and performing the refresh for the given rank of memory substantially immediately upon the commencement of the refresh interval.

15. The method of claim 13, wherein performing, in the refresh order, refreshes for the two or more ranks of memory during the refresh interval comprises:
while a refresh is performed for a preceding rank of memory of the ranks of memory in the refresh order, performing corresponding buffered memory accesses for a given rank of memory of the ranks of memory, thereby preparing the given rank of memory for a subsequent refresh.

16. The method of claim 15, further comprising:
while the refresh is performed for the preceding rank of memory of the ranks of memory in the refresh order, pausing sending specified memory commands to the given rank of memory, thereby preparing the given rank of memory for the subsequent refresh.

17. The method of claim 13, further comprising:
dividing the refresh interval into a number of sub-intervals based at least in part on a number of the ranks of memory for which a refresh is to be performed during the refresh interval, wherein a refresh is to be performed for one of the two or more ranks of memory during each sub-interval.

18. The method of claim 13, wherein:
the properties of the buffered memory accesses comprise a count of the buffered memory accesses; and
a rank of memory having more buffered memory accesses is included later in the refresh order than a rank of memory having fewer buffered memory accesses.

19. The method of claim 13, wherein:
the properties of the buffered memory accesses comprise a type of each of the memory accesses; and
a rank of memory having more of a given type of buffered memory accesses is included earlier in the refresh order than a rank of memory having fewer of the given type of buffered memory accesses.

20. The method of claim 13, wherein:
the properties of the buffered memory accesses comprise a priority of the memory accesses; and
a rank of memory having more higher-priority buffered memory accesses is included earlier in the refresh order than a rank of memory having fewer higher-priority buffered memory accesses.

21. The method of claim 13, wherein the refresh logic is further configured to:
based on, in addition to the one or more properties of the buffered memory accesses, operations performed or to be performed by the memory controller, determining a refresh order for performing refreshes during the refresh interval for the at least one of the ranks of memory.

* * * * *